(12) United States Patent
Tan et al.

(10) Patent No.: US 7,384,714 B2
(45) Date of Patent: Jun. 10, 2008

(54) ANTI-REFLECTIVE SIDEWALL COATED ALTERNATING PHASE SHIFT MASK AND FABRICATION METHOD

(75) Inventors: Sia Kim Tan, Singapore (SG);
Qunying Lin, Singapore (SG);
Liang-Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 676 days.

(21) Appl. No.: 10/973,526

(22) Filed: Oct. 25, 2004

(65) Prior Publication Data
US 2006/0088771 A1   Apr. 27, 2006

(51) Int. Cl.
*G03F 1/00* (2006.01)
(52) U.S. Cl. ......................................................... 430/5
(58) Field of Classification Search .................... 430/5, 430/322–324, 394
See application file for complete search history.

(56) References Cited

U.S. PATENT DOCUMENTS

| 5,411,824 | A | 5/1995 | Vasudev et al. |
| 5,418,095 | A | 5/1995 | Vasudev et al. |
| 5,472,811 | A | 12/1995 | Vasudev et al. |
| 6,787,457 | B2 * | 9/2004 | Yanagawa et al. .......... 438/639 |
| 2003/0228526 | A1 * | 12/2003 | Bukofsky et al. .............. 430/5 |

* cited by examiner

*Primary Examiner*—Stephen Rosasco
(74) *Attorney, Agent, or Firm*—Mikio Ishimaru

(57) ABSTRACT

A method for fabricating a phase shift mask is provided. A trenched phase shift mask having portions of a light-blocking layer thereon is formed. A layer of anti-reflective material is then formed on the trenched phase shift mask and the portions of the light-blocking layer. The anti-reflective material is then removed on horizontal surfaces of the trenched phase shift mask and of the portions of the light-blocking layer.

24 Claims, 6 Drawing Sheets

ANTI-REFLECTIVE SIDEWALL COATED ALTERNATING PHASE SHIFT MASK AND FABRICATION METHOD

TECHNICAL FIELD

The present invention relates generally to photolithography, and more particularly to photolithographic phase shift masks and mask fabrication methods.

BACKGROUND ART

Almost every modern electronic product, ranging from toys to massive computers, now uses integrated circuits ("ICs"). ICs are generally made using photolithographic processes that involve manufacturing a template containing patterns of the electrical circuit as transparent and opaque areas. The patterned template is referred to as a "reticle" or "mask". Generally, a number of these masks are required for manufacturing a complete device on the wafer.

A radiation source, such as a light, is used to copy or "pattern" multiple images of the mask onto a photosensitive material, such as a photoresist, on the surface of a silicon wafer. Once features are patterned on the photoresist, further processing is performed to form various structures on the silicon wafer. The completed wafer is then cut (or "diced") to form the individual ICs.

Engineers typically use computer-aided design ("CAD") to create a schematic design of the mask. One technique, Levenson phase shifting, also known as alternating aperture phase shifting, is used to create small features on ICs. Such small features are generated by a pair of areas in the mask called shifters.

One such mask is an alternating element phase shift mask ("PSM") that normally includes a substantially transparent substrate composed, for example, of quartz. Phase-shifting material is situated in regions on the mask substrate to provide a phase shift to light radiation as it passes through the transparent areas of the mask. The phase-shifting regions can be formed in several ways, such as by depositing patterns of transparent films of appropriate thickness on the quartz substrate, or by etching vertical trench patterns into the quartz substrate.

The phase-shifting material may be, for example, silicon nitride or other suitable transparent materials such as oxides or oxynitrides. It may also simply be a thicker (or thinner) region of the same substrate material (e.g., quartz). In such an alternating element PSM, discrete non-phase-shifting components are then disposed alternately adjacent to discrete phase-shifting components.

An attenuated PSM is a PSM that contains discrete layers of absorbers, composed for example of chromium, disposed on the mask substrate. The absorber layers selectively attenuate the light that is passed therethrough.

Hybrid attenuated-unattenuated PSMs can also be combined with alternate element PSMs to provide more complex PSM designs.

Shifters are arranged to exploit the changes in the phases of the light that passes through them. For example, two shifters can be configured on a mask to shine light on the same region of a photoresist. In a region on the photoresist where the light passing through one of the shifters is in phase with the light passing through the other shifter, a feature can be created on the photoresist that is narrower than the distance between the two shifters. Where the light passing through the shifters is out of phase, no feature is created. By reducing the distance between the two shifters, very small features can be created on the photoresist. The width of the feature can be considerably less than could be produced by the same optical system without phase shifting.

In a trenched PSM, the trenches are arranged to alternate with untrenched areas in order to provide alternating regions of phase-reversed light and unreversed light. However, the stray light from the sidewalls of the trenches usually interferes with the normal (desirable) incident light. This interference lowers the intensity of the light that exits from the trenches. Due to the lower intensity of the light that exits from the trenched areas, the alternating trenched and untrenched areas will not provide equal light intensities on the target photoresist. The resulting intensity imbalance then causes the printed photoresist features on the wafer to have placement errors.

Opaque areas, typically of chrome, are usually provided on PSM masks to block the light in areas where features are not to be formed. One known solution for the intensity imbalance issue is to provide undercuts beneath the chrome and to bias (i.e., to thin) the trench chrome opening. However, undercuts limit the minimum chrome size due to problems with peeling of the chrome. Biasing reduces the chrome that remains and hence also contributes to the chrome peeling issue.

Another mask solution is a sidewall chrome alternating aperture mask ("SCAAM") in which the sidewalls of the trenches are coated with a light-absorbing layer of chrome. The SCAAM technique requires less biasing and undercutting due to the chrome that is deposited on the sidewall for eliminating the problem of stray sidewall light.

Unfortunately, however, there are issues with the SCAAM technique that limit its use. One issue is the complexity of forming the additional sidewall chrome layer. This requires an additional chrome layer deposition process, which includes an additional mask-making process for the chrome deposition, additional photoresist processing that includes a complicated resist topography, etching of the chrome, and so forth. These issues limit the application of the SCAAM technique.

Thus, a need still remains for a trenched PSM method and apparatus that wilt effectively yet inexpensively eliminate intensity imbalances between the alternating trenched and untrenched areas of the mask. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for fabricating a phase shift mask. A trenched phase shift mask having portions of a light-blocking layer thereon is formed. A layer of anti-reflective material is then formed on the trenched phase shift mask and the portions of the light-blocking layer. The anti-reflective material is then removed on horizontal surfaces of the trenched phase shift mask and of the portions of the light-blocking layer.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
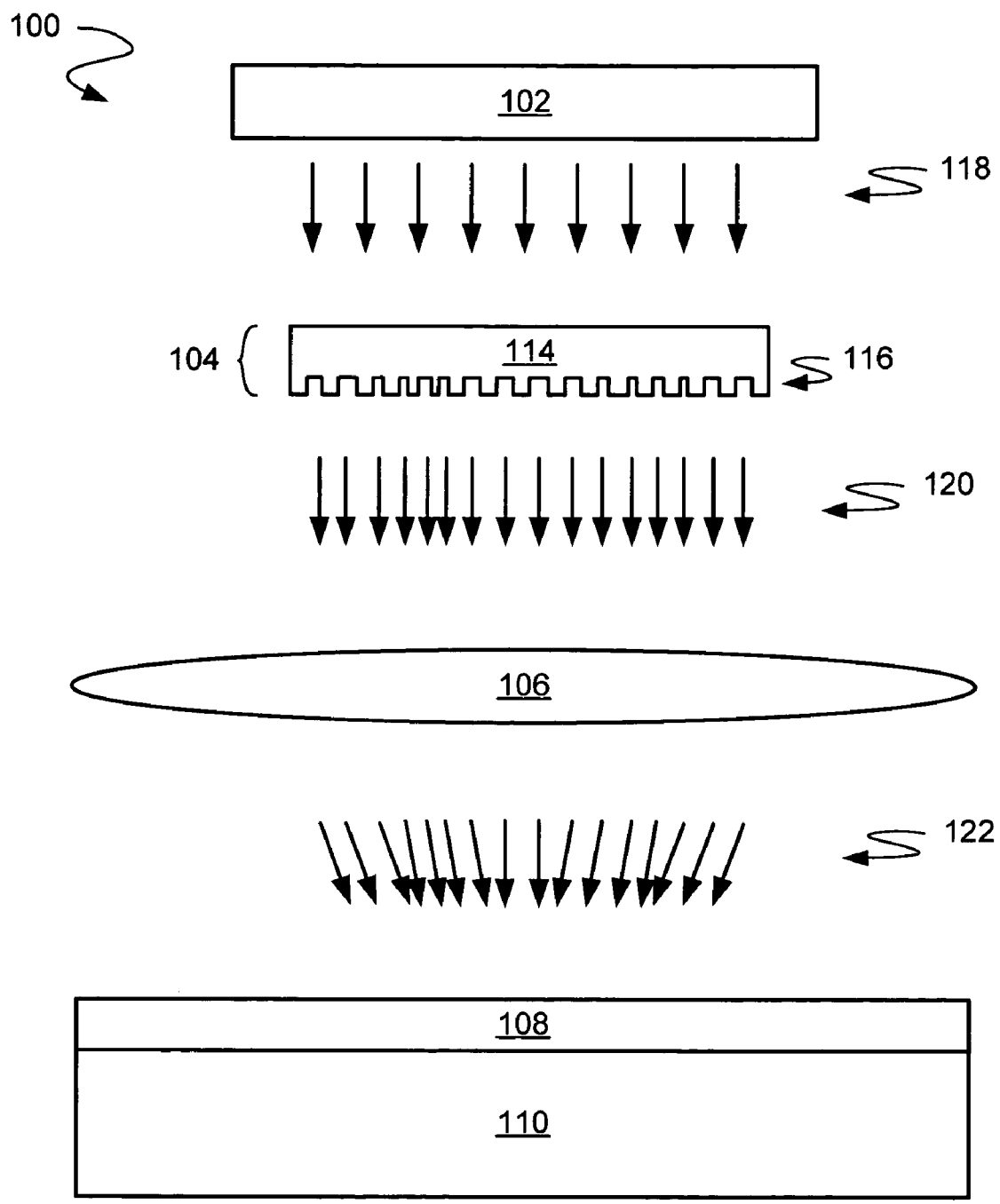
FIG. 1 is a simplified schematic of a photolithographic system.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

Similarly, the drawings showing embodiments of the invention are semi-diagrammatic and not to scale and, particularly, some of the dimensions are for the clarity of presentation and are shown exaggerated in the FIGS. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the photolithographic mask, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Although the invention is described hereinbelow with respect to single-wavelength ultraviolet illumination, it will be readily understood that the invention is applicable to any wavelength of radiation, and that appropriate modifications for other wavelengths will be obvious to those of ordinary skill in the art based upon the description of the present invention provided herein.

Referring now to FIG. 1, therein is shown a simplified schematic of a photolithographic system 100. In the photolithographic system 100, single-wavelength ultraviolet radiation is directed from an illumination source 102 through a photomask 104 and a lens 106 onto a photoresist layer 108 that has been deposited onto a semiconductor wafer 110. The photomask 104 of the photolithographic system 100 is located at, and thus defines, a first plane, which is the plane of the photomask 104. Similarly, the photoresist layer 108 on the semiconductor wafer 110 is located at, and thus defines, a second plane, which is the plane of the photoresist layer 108.

The photomask 104 includes a light-transparent substrate 114, of a material such as fused silica or quartz, with a patterned mask 116 that is formed on one surface thereof as explained further hereinafter.

The illumination source 102 produces light 118 that the photomask 104 selectively allows through as patterned light 120 to be focused by the lens 106. Focused patterned light 122 reproduces the mask pattern of the patterned mask 116 on selected areas of the photoresist layer 108.

The photoresist layer 108, as is conventionally known, is a photosensitive material that is used in photolithography to transfer patterns from a mask onto a wafer for forming integrated circuit elements thereon.

Thus, after exposure, the patterned photoresist layer 108 is used as a mask in such a photolithographic process to form features or to implant regions on the semiconductor wafer 110, or on various layers of material previously deposited or grown on the semiconductor wafer 110.

The goal in the photolithographic field is to keep reducing the size of such features and implant regions. Unfortunately, even a geometrically perfect photolithographic lens cannot separate two points below a minimum distance. When the two points are less than this minimum distance from each other, diffraction and interference effects prevent them from being separated or "resolved". Such diffraction effects, which are due to the wave nature of the light 118, cause peaks and valleys to occur in the intensity of the light 118 passing through an opening, such as the openings in the patterned mask 116, and falling on the photoresist layer 108 on the semiconductor wafer 110. Interference effects occur with side-by-side openings, where the peaks and valleys of the light waves can either interfere so as to cancel each other out, or reinforce and amplify each other, depending on the locations of the openings.

When two points are very close, the diffraction effect spreads the light from these two points across the imaging lens. If the two points are sufficiently close, the light will be diffracted out of the path of the lens. In this case, the points will be too close to each other and they will be under the limit of resolution of the system. The resolution of a non-perfect lens depends upon the wavelength of the light source and the numerical aperture ("NA") of the lens. Two images are considered as being resolvable when the intensity between them drops to 80 percent of the image intensity. Thus, two images are considered resolvable when the following equation is fulfilled:

$$2d = 0.6 \, \lambda/NA$$

where:

2d is the separation of the two images;

$\lambda$ is the wavelength of the illumination source 102; and

NA is the numerical aperture of the lens 106.

In an effort to overcome diffraction and interference problems, various phase-shifting systems have accordingly been developed.

Figure 2:
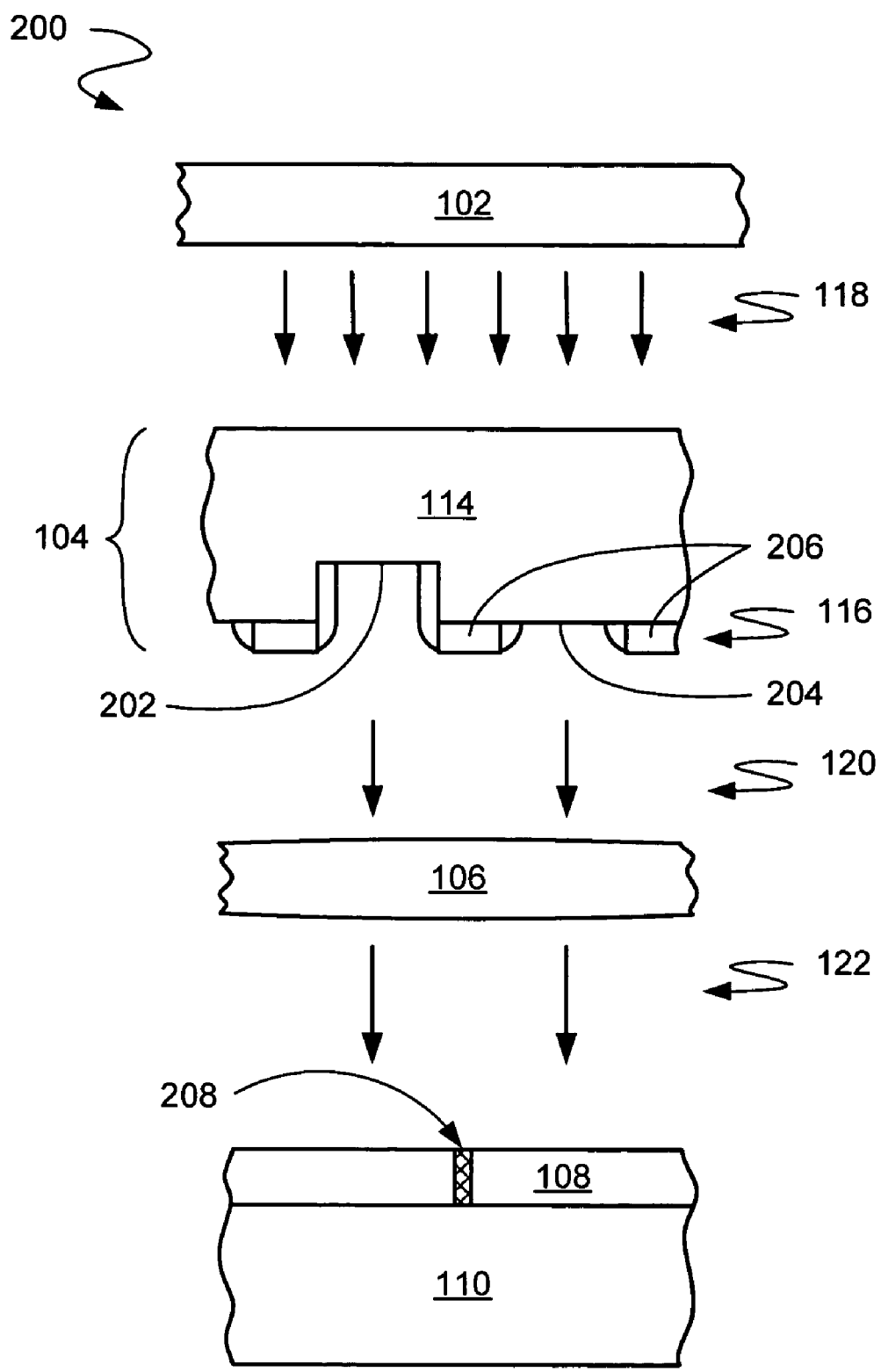
FIG. 2 is a simplified schematic of a phase-shifting photolithographic system utilizing a mask according to an embodiment of the present invention.

Referring now to FIG. 2, therein is shown a simplified schematic of a phase-shifting photolithographic system 200 utilizing a mask according to an embodiment of the present invention. The center portion of the lens 106 is pictured where the angle of the focused patterned light 122 is least affected. As in the photolithographic system 100 (FIG. 1), light 118 of a single wavelength is directed from the illumination source 102 through the photomask 104 and the lens 106 onto the photoresist layer 108 on the semiconductor wafer 110.

Since phase shifting of light occurs as a function of the thickness of the phase shifter material, the patterned mask 116 of the photomask 104 is patterned with trenches 202 to cause phase shifting relative to the adjacent untrenched areas of the mask. In such a trenched phase shift mask ("PSM"), the difference in the thickness of the light-transmissive mask material at the trenches 202 compared with the thickness of the untrenched substrate regions 204 produces a phase shift of 180° relative to the untrenched substrate regions 204. This corresponds to an optical path length difference of $\lambda/2$. Thus, the phase-shifting trenches 202 are substantially out of phase by 180°, or n radians, with the untrenched substrate regions 204.

Some portions of the untrenched substrate regions 204 are often covered with a light-blocking layer, such as a chrome layer 206. The chrome layer 206 prevents light from passing through the patterned mask 116 in those covered portions and defines and delimits the light-transmitting areas of the trenches 202 and the light-transmitting areas of the untrenched substrate regions 204.

Since phases of light that are substantially out of phase neutralize and therefore cancel where they overlap, and vice versa, the trenches 202 and the untrenched substrate regions 204 cause destructive (neutralizing) and constructive (reinforcing) interference in the patterned light 120 in the second plane of the photoresist layer 108. This creates a photoresist feature 208 in the photoresist layer 108 that is below, or smaller than, the inherent resolution limit of the lens 106 itself. Accordingly, the phase-shifting photolithographic system 200 allows features such as the photoresist feature 208 to be much smaller than a system not using phase shifting.

In a single-trench alternating aperture PSM, the stray light that reflects from the sidewalls of the trench will interfere with the normal incident light rays (such as the light 118). This interference will lower the intensity of the light (e.g., 180° phase light) exiting from the trenches as compared to the light (e.g., 0° phase light) exiting from the light-transmitting areas of the unetched substrate. This disparity results in an intensity imbalance that causes a placement error for the photoresist features (such as the photoresist feature 208) on the semiconductor wafer 110. One known solution is to have undercuts beneath the chrome layer (such as the chrome layer 206) and biasing (i.e., thinning) of the chrome at the trench opening. However, undercuts can limit the minimum chrome size due to the risk of chrome peeling, and biasing can reduce the chrome that remains, thereby also contributing to the risk of chrome peeling.

One prior method for addressing some of these problems is the use of a sidewall chrome alternating aperture mask ("SCAAM"). A SCAAM does not require as much biasing or undercutting because it uses chrome deposited on the sidewalls of the trenches to eliminate the sidewall stray light. However, a SCAAM introduces the complexity of another chrome layer deposition and mask-making process. This involves many additional complications, such as the need for a second mask-writing process, the need to deal with challenging photoresist topographies, and so forth, that limit the application of the SCAAM technique.

Figure 3:
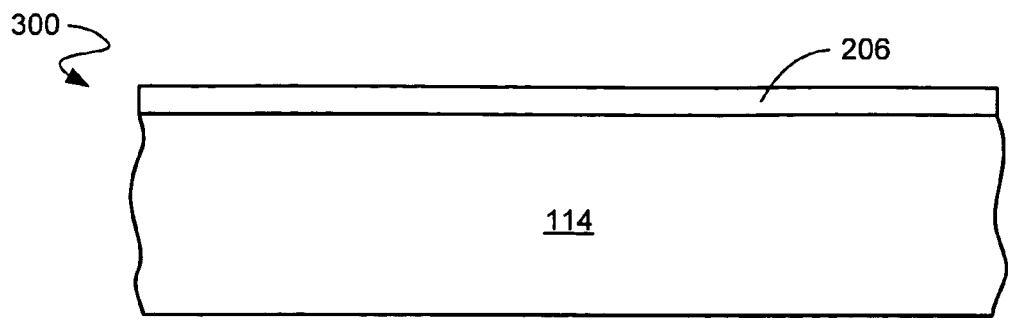
FIG. 3 is a view of the first stage in the formation of an anti-reflective sidewall coated alternating PSM according to an embodiment of the present invention.

Referring now to FIG. 3, therein is shown the first stage 300 in the formation, according to an embodiment of the present invention, of an anti-reflective sidewall coated alternating PSM, such as the photomask 104 (FIG. 1). At this early stage, the light-transparent substrate 114 is essentially unprocessed other than for the deposition of the chrome layer 206 thereon.

Figure 4:
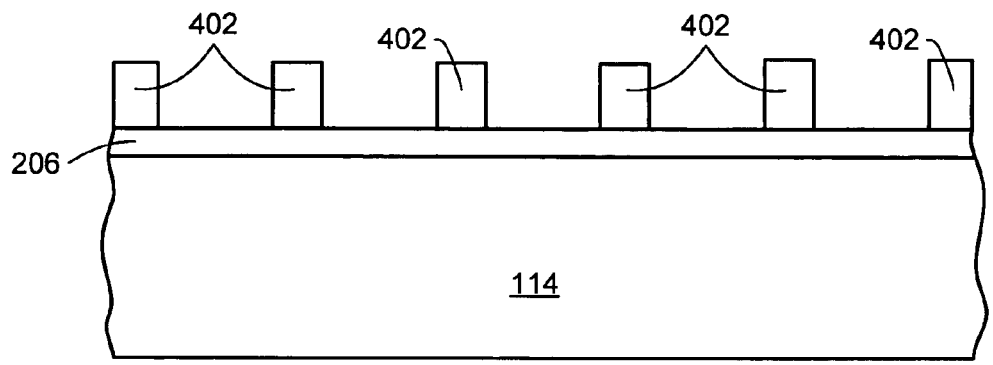
FIG. 4 is the structure of FIG. 3 after deposition of a mask for etching of the chrome layer.

Referring now to FIG. 4, therein is shown the structure of FIG. 3 following the deposition thereon of a mask 402 to be used for etching the chrome layer 206.

Figure 5:
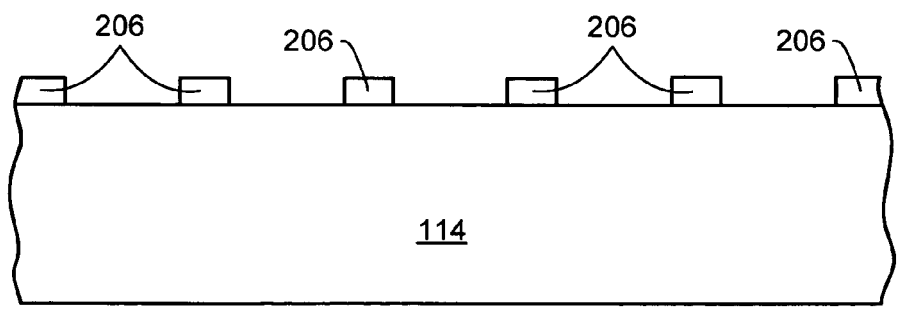
FIG. 5 is the structure of FIG. 4 after etching the chrome layer and removing the mask.

Referring now to FIG. 5, therein is shown the structure of FIG. 4 following etching of the portions of the chrome layer 206 (FIG. 4) not masked by the mask 402 (FIG. 4), followed by removal of the mask 402, to leave the remaining portions of the chrome layer 206 shown in FIG. 5.

Figure 6:
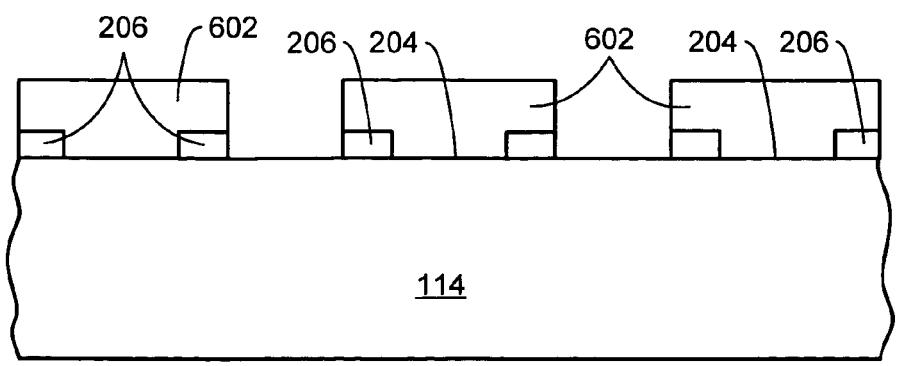
FIG. 6 is the structure of FIG. 5 after formation of a mask for etching the light-transparent substrate.

Referring now to FIG. 6, therein is shown the structure of FIG. 5 following formation thereon of a mask 602 to be used for etching portions of the light-transparent substrate 114.

Figure 7:
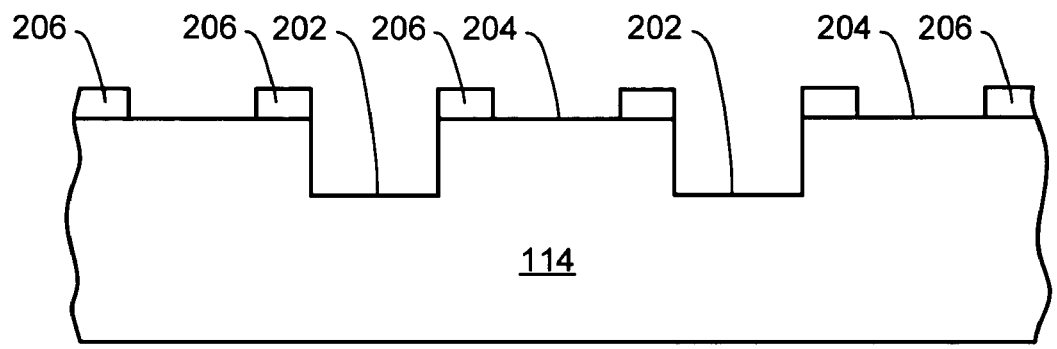
FIG. 7 is the structure of FIG. 6 after etching the light-transparent substrate to form trenches and removing the mask.

Referring now to FIG. 7, therein is shown the structure of FIG. 6 following etching of portions of the light-transparent substrate 114 not protected by the mask 602 (FIG. 6) to form the trenches 202 therein, followed by removal of the mask 602.

Figure 8:
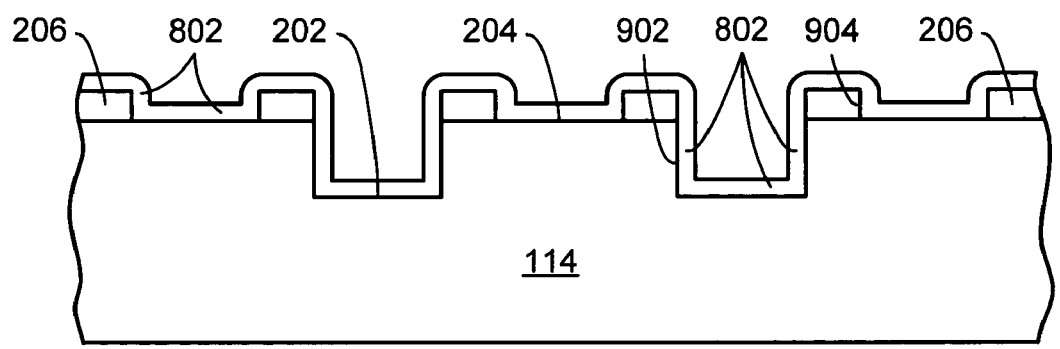
FIG. 8 is the structure of FIG. 7 after deposition of an anti-reflective coating layer.

Referring now to FIG. 8, therein is shown the structure of FIG. 7 following deposition of an anti-reflective coating ("ARC") layer 802 thereon. In one embodiment, the ARC layer 802 is a layer of chromium that is deposited, for example, using a vapor deposition process.

Figure 9:
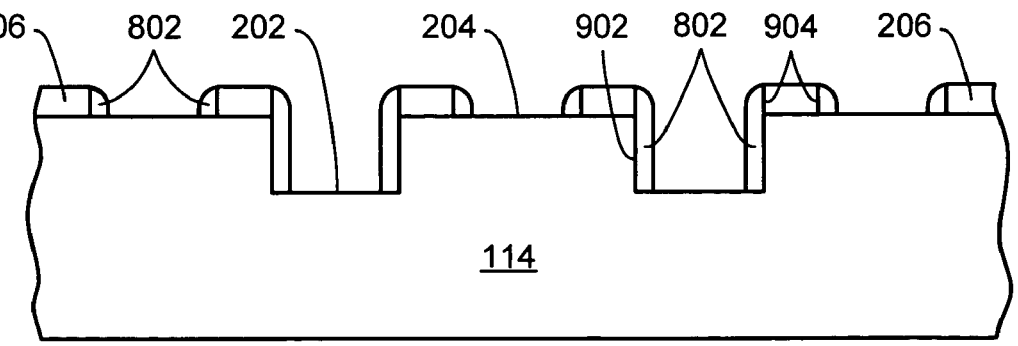
FIG. 9 is the structure of FIG. 8 after an anisotropic dry etch of the anti-reflective coating layer.

Referring now to FIG. 9, therein is shown the completed photomask 104, which is the structure of FIG. 8 following an anisotropic dry etch of the ARC layer 802. Anisotropically etching the ARC layer 802 removes only the ARC layer material that is on horizontal surfaces of the trenched phase shift photomask 104, but not the ARC layer material that is on the vertical surfaces thereof. The anisotropic etch thus removes the ARC layer 802 in the central portions of the trenches 202 and in the central portions of the untrenched substrate regions 204 between the remaining portions of the chrome layer 206, thereby selectively exposing these regions without the need for additional masking. The trenches 202 and the exposed portions of the untrenched substrate regions 204 have thereby been restored to a light-transmissive state.

However, the anisotropic etch has allowed the ARC layer 802 (see FIG. 9) to remain on the sidewalls 902 of the trenches 202 and the sidewalls 904 of the remaining portions of the chrome layer 206. As a result, the ARC layer 802 is able to actively cancel any stray light that would otherwise reflect from the sidewalls 902 and 904, thereby improving the intensity balance for the non-phase-shifted light (e.g., the 0° phase light) and the phase-shifted light (e.g., the 180° phase light) that is transmitted through corresponding light-transmissive portions of the photomask 104.

Figure 10:
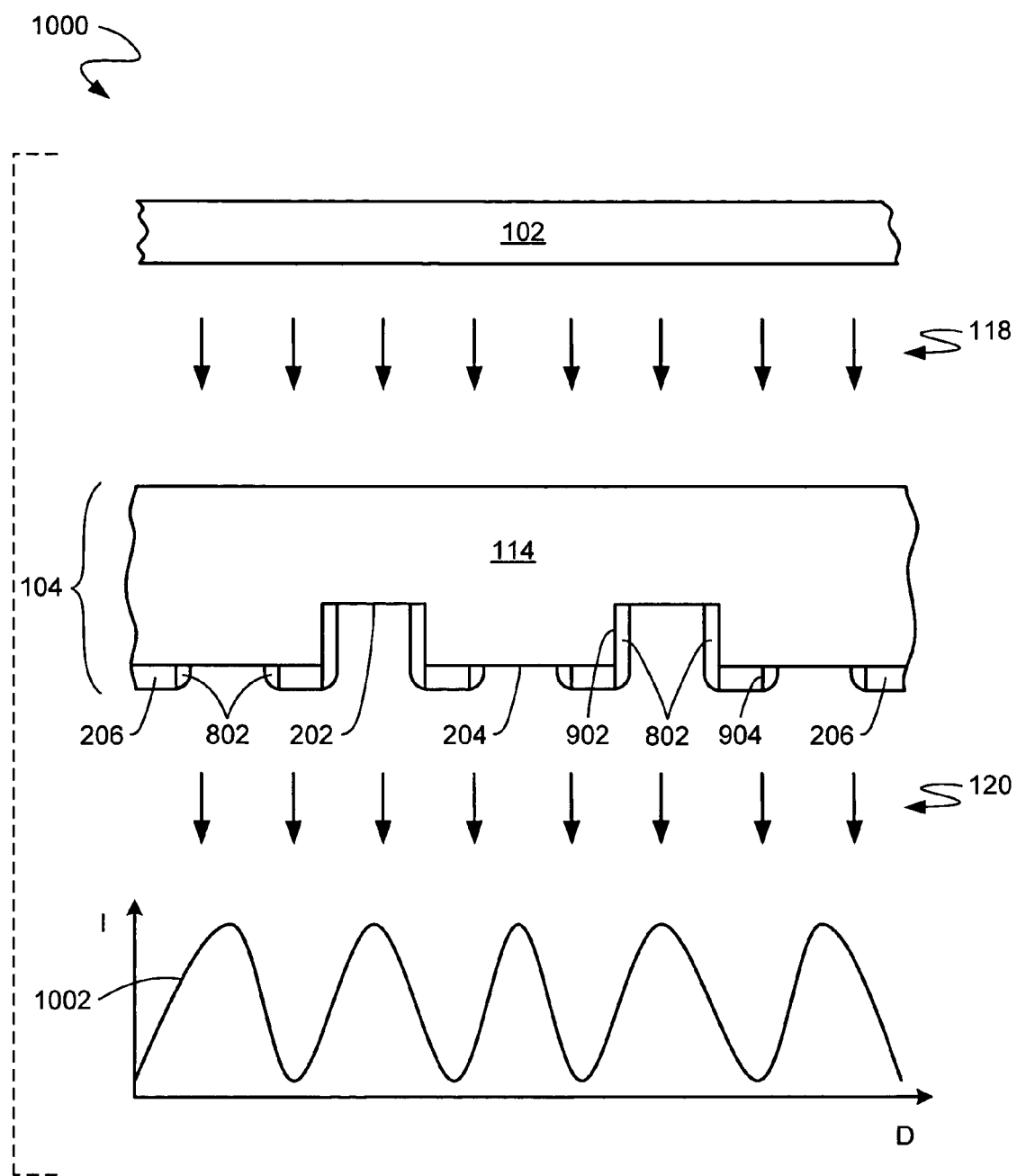
FIG. 10 is a figurative representation depicting the light intensity of patterned light in the immediate vicinity of the photomask as it exits therefrom.

Referring now to FIG. 10, therein is shown a figurative representation 1000 depicting the light intensity 1002 of the patterned light 120 in the immediate vicinity of the photomask 104 as it exits therefrom. The intensity ("I") of the patterned light 120, as shown by the curve of the light intensity 1002, correlates with the positional displacement or distance ("D") of the several corresponding light-transmissive portions of the trenches 202 and the light-transmissive portions of the untrenched substrate regions 204. As confirmed by this depiction, the various respective light intensity maxima are substantially equal. This shows that the amount of light, or the light intensity, is substantially the same for both the phase-shifted and the phase-unshifted regions of the photomask 104. Intensity imbalances between the alternating trenched and untrenched areas of the photomask 104 have therefore been eliminated.

The elimination of the intensity imbalances, according to an embodiment of the present invention, is afforded by the ARC layer 802 on the sidewalls 902 of the trenches 202 and on the sidewalls 904 of the remaining portions of the chrome layer 206. This prevents additional light (e.g., light arising from internal reflections) within the photomask 104 from augmenting or diminishing the light that exits from the trenches. (Such "additional" light is light that is other than and in addition to the normal, direct incident light from the illumination source 102.) Otherwise, such additional light will cause an intensity imbalance between the light from the trenched areas and the light from the untrenched areas (i.e., between the phase-shifted light and the non-phase-shifted light). Instead, the ARC layer 802 on the sidewalls 902 of the trenches 202 absorbs such stray light so that the net intensity of the light being emitted from a unit area of the trenches 202 is the same as that being emitted from an exposed unit area of the untrenched substrate regions 204.

Advantageously, the present invention eliminates intensity imbalances by forming the ARC layer 802 on all of the sidewalls of the light-emitting regions of the photomask 104, including the sidewalls 904 of the remaining portions of the chrome layer 206. Thus, by coating all sidewalls, including the sidewalls 904 of the remaining portions of the chrome layer 206, the presence of the ARC layer 802 at the edges of each of these light-emitting regions, both trenched and untrenched, equally reduces the dimensions thereof, so that the transverse extents of these light-emitting openings remain equal. Intensity imbalances therebetween and thereamong are thereby eliminated.

Thus, the present invention provides efficient, inexpensive, and highly effective structures and methods that eliminate stray light from the sidewalls of the trenches 202. A particular advantage of the invention is that the ARC layer 802 is formed and retained on both sides of the remaining portions of the chrome layer 206. The presence of the ARC layer 802 on both sides of the remaining portions of the chrome layer 206 thereby eliminates the need to bias up either the light-transmitting areas of the trenches 202 or the light-transmitting areas of the untrenched substrate regions 204, since both light-transmitting openings have the same opening size. Advantageously, this means that little work needs to be performed in sizing up the openings of either the light-transmitting areas of the trenches 202 or the light-transmitting areas of the untrenched substrate regions 204 to match the sizes of the other.

The ARC layer 802 may advantageously be formed of appropriate materials other than chromium, such as, but not limited to, molybdenum, aluminum, aluminum oxide, gold, silicon, silicon oxynitrides, silver, nickel, tungsten, and their alloys and silicides, as well as compounds and/or combinations thereof. The choice will depend, in part, upon the particular combination that is needed of film refractive index, extinction coefficient, the wavelength of the illumination source, and sufficiently high selectivity to the mask substrate material (e.g., quartz) during the etching process. As a general rule, the higher the extinction coefficient, the thinner the absorbing film needs to be.

Figure 11:
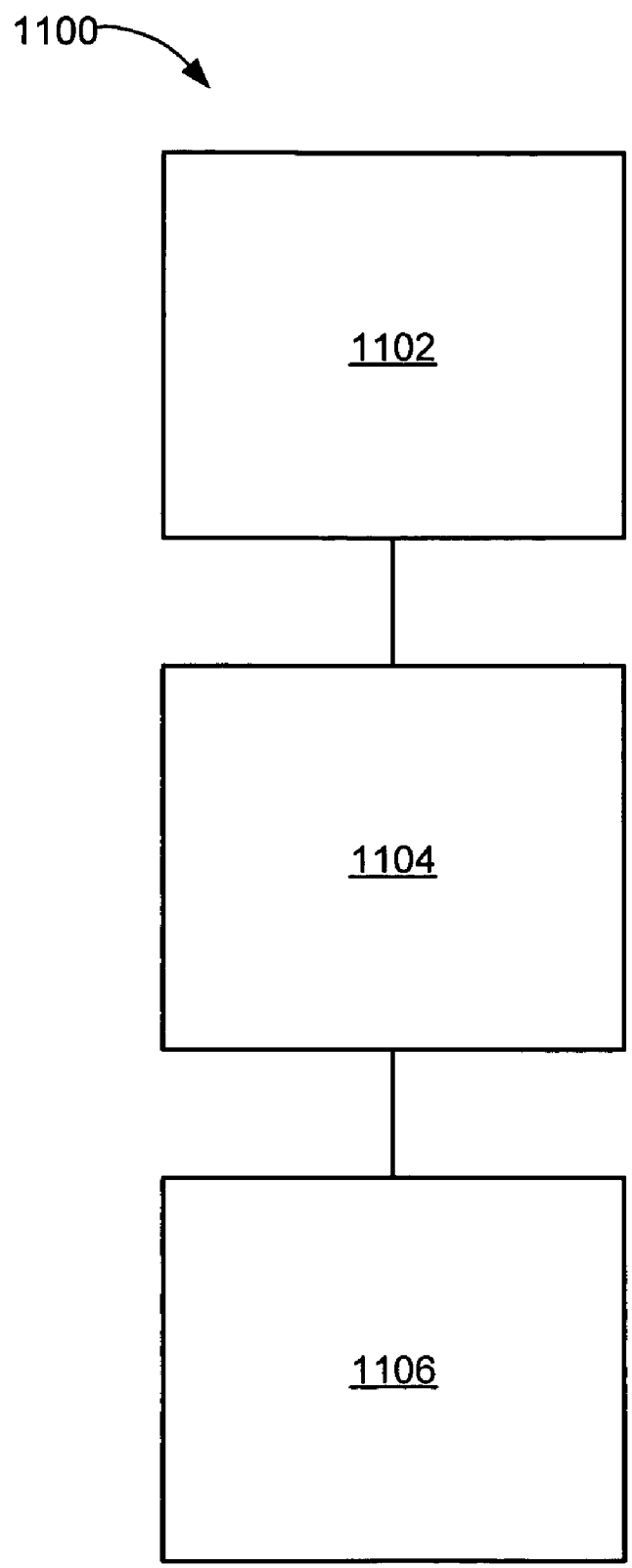
FIG. 11 is a flow chart of a method for fabricating a phase shift mask in accordance with an embodiment of the present invention.

Referring now to FIG. 11, therein is shown a flow chart of a method 1100 for fabricating a phase shift mask in accordance with an embodiment of the present invention. The method 1100 includes forming a trenched phase shift mask having portions of a light-blocking layer thereon in a block 1102; forming a layer of anti-reflective material on the trenched phase shift mask and the portions of the light-blocking layer in a block 1104; and removing the anti-reflective material on horizontal surfaces of the trenched phase shift mask and of the portions of the light-blocking layer in a block 1106.

It has been discovered that the present invention has numerous advantages. Principally, it provides a trenched PSM method and apparatus that effectively yet inexpensively eliminate intensity imbalances between the alternating trenched and untrenched areas of the mask.

Another advantage is that it readily forms trenched mask structures having trenched and untrenched light-transmitting openings that are both of the same size.

In one embodiment, yet another advantage is that the chrome layer on the substrate has the light-absorbing ARC layer on both sides thereof, thereby eliminating the need to bias up the untrenched light openings.

Thus, it has been discovered that the trenched PSM method and apparatus of the present invention furnish important and heretofore unknown and unavailable solutions, capabilities, and functional advantages for photolithographic masks and mask-making processes. The resulting processes and configurations are straightforward, economical, uncomplicated, highly versatile and effective, can be implemented by adapting known technologies, and are thus readily suited for manufacturing anti-reflective sidewall coated alternating phase shift masks in a manner that is compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for fabricating a phase shift mask, comprising:
    forming a trenched phase shift mask having portions of a light-blocking layer thereon;
    forming a layer of anti-reflective material on the trenched phase shift mask and the portions of the light-blocking layer; and
    removing the anti-reflective material on horizontal surfaces of the trenched phase shift mask and on the portions of the light-blocking layer.

2. The method of claim 1 wherein forming a trenched phase shift mask having portions of a light-blocking layer thereon further comprises forming opaque chromium regions on the trenched phase shift mask.

3. The method of claim 1 wherein forming a layer of anti-reflective material on the trenched phase shift mask and the portions of the light-blocking layer further comprises using a vapor deposition process to deposit a layer of chromium thereon.

4. The method of claim 1 wherein removing the anti-reflective material on horizontal surfaces of the trenched phase shift mask and the portions of the light-blocking layer further comprises anisotropically etching the layer of anti-reflective material to remove portions thereof in the central portions of the trenches and in the central portions of the untrenched substrate regions between the portions of the light-blocking layer.

5. The method of claim 1 wherein the anti-reflective material includes a material selected from chromium, molybdenum, aluminum, aluminum oxide, gold, silicon, silicon oxynitrides, silver, nickel, tungsten, an alloy thereof, a silicide thereof, a compound thereof, and a combination thereof.

6. A method for fabricating a phase shift mask, comprising:
forming a trenched phase shift mask having portions of a light-blocking layer thereon by:
providing a light-transparent substrate;
depositing a light-blocking layer on the light-transparent substrate;
forming a first mask on the light-blocking layer for etching the light-blocking layer;
etching the light-blocking layer not masked by the first mask to form the portions of the light-blocking layer;
removing the first mask;
forming a second mask on at least portions of the light-transparent substrate and the light-blocking layer for etching portions of the light-transparent substrate;
etching the light-transparent substrate not protected by the second mask to form trenches in the light-transparent substrate; and
removing the second mask;
forming a layer of anti-reflective material on the trenched phase shift mask and the portions of the light-blocking layer; and
removing the anti-reflective material on horizontal surfaces only of the trenched phase shift mask and of the portions of the light-blocking layer but not from vertical surfaces thereof.

7. The method of claim 6 wherein forming a trenched phase shift mask having portions of a light-blocking layer thereon further comprises forming opaque chromium regions on the trenched phase shift mask.

8. The method of claim 6 wherein forming a layer of anti-reflective material on the trenched phase shift mask and the portions of the light-blocking layer further comprises using a vapor deposition process to deposit a layer of chromium thereon.

9. The method of claim 6 wherein removing the anti-reflective material on horizontal surfaces only of the trenched phase shift mask and the portions of the light-blocking layer but not from vertical surfaces thereof further comprises anisotropically etching the layer of anti-reflective material to remove portions thereof in the central portions of the trenches and in the central portions of the untrenched substrate regions between the portions of the light-blocking layer without additional masking.

10. The method of claim 6 wherein the anti-reflective material includes a material selected from chromium, molybdenum, aluminum, aluminum oxide, gold, silicon, silicon oxynitrides, silver, nickel, tungsten, an alloy thereof, a silicide thereof, a compound thereof, and a combination thereof.

11. A phase shift mask, comprising:
a trenched phase shift mask having portions of a light-blocking layer thereon;
a layer of anti-reflective material on the trenched phase shift mask and the portions of the light-blocking layer; and
anti-reflective material on vertical surfaces of the trenched phase shift mask and of the portions of the light-blocking layer.

12. The mask of claim 11 wherein the trenched phase shift mask having portions of a light-blocking layer thereon further comprises opaque chromium regions on the trenched phase shift mask.

13. The mask of claim 11 wherein the layer of anti-reflective material on the trenched phase shift mask and the portions of the light-blocking layer further comprises a layer of vapor-deposited chromium thereon.

14. The mask of claim 11 wherein the anti-reflective material on vertical surfaces of the trenched phase shift mask and the portions of the light-blocking layer further comprises a layer of anti-reflective material anisotropically etched to remove portions thereof in the central portions of the trenches and in the central portions of the untrenched substrate regions between the portions of the light-blocking layer.

15. The mask of claim 11 wherein the anti-reflective material includes a material selected from chromium, molybdenum, aluminum, aluminum oxide, gold, silicon, silicon oxynitrides, silver, nickel, tungsten, an alloy thereof a silicide thereof, a compound thereof, and a combination thereof.

16. A phase shift mask, comprising:
a trenched phase shift mask having portions of a light-blocking layer thereon formed by:
providing a light-transparent substrate;
depositing a light-blocking layer on the light-transparent substrate;
forming a first mask on the light-blocking layer for etching the light-blocking layer;
etching the light-blocking layer not masked by the first mask to form the portions of the light-blocking layer;
removing the first mask;
forming a second mask on at least portions of the light-transparent substrate and the light-blocking layer for etching portions of the light-transparent substrate;
etching the light-transparent substrate not protected by the second mask to form trenches in the light-transparent substrate; and
removing the second mask;
a layer of anti-reflective material on the trenched phase shift mask and the portions of the light-blocking layer; and
anti-reflective material on vertical surfaces only of the trenched phase shift mask and of the portions of the light-blocking layer but not on horizontal surfaces thereof.

17. The mask of claim 16 wherein the trenched phase shift mask having portions of a light-blocking layer thereon further comprises opaque chromium regions on the trenched phase shift mask.

18. The mask of claim 16 wherein the layer of anti-reflective material on the trenched phase shift mask and the portions of the light-blocking layer further comprises a layer of vapor-deposited chromium thereon.

19. The mask of claim 16 wherein the anti-reflective material on vertical surfaces only of the trenched phase shift mask and the portions of the light-blocking layer but not on horizontal surfaces thereof further comprises a layer of anti-reflective material anisotropically etched to remove portions thereof in the central portions of the trenches and in the central portions of the untrenched substrate regions between the portions of the light-blocking layer without additional masking.

20. The mask of claim 16 wherein the anti-reflective material includes a material selected from chromium, molybdenum, aluminum, aluminum oxide, gold, silicon, silicon oxynitrides, silver, nickel, tungsten, an alloy thereof, a silicide thereof, a compound thereof, and a combination thereof.

21. A method of fabricating an integrated circuit comprising:
   providing an integrated circuit substrate;
   forming a light sensitive layer on the integrated circuit substrate;
   providing a phase shift mask further comprising:
      a trenched phase shift mask having portions of a light-blocking layer thereon;
      a layer of anti-reflective material on the trenched phase shift mask and the portions of the light-blocking layer; and
      anti-reflective material on vertical surfaces of the trenched phase shift mask and of the portions of the light-blocking layer;
   using the phase shift mask to form a plurality of patterns on the light sensitive layer; and
   processing the semiconductor wafer to form integrated circuits thereon.

22. The method of claim 21 wherein the trenched phase shift mask having portions of a light-blocking layer thereon further comprises opaque chromium regions on the trenched phase shift mask.

23. A method of fabricating an integrated circuit die comprising:
   providing a silicon wafer;
   forming a photoresist on the silicon wafer;
   providing a phase shift mask further comprising:
      a trenched phase shift mask having portions of a light-blocking layer thereon;
      a layer of anti-reflective material on the trenched phase shift mask and the portions of the light-blocking layer; and
      anti-reflective material on vertical surfaces of the trenched phase shift mask and of the portions of the light-blocking layer;
   exposing the photoresist to radiation through the phase shift mask to form patterns on the photoresist; and
   processing the silicon wafer to form integrated circuits thereon.

24. The method of claim 23 wherein the trenched phase shift mask having portions of a light-blocking layer thereon further comprises opaque chromium regions on the trenched phase shift mask.

* * * * *